United States Patent [19]

Pope et al.

[11] 4,163,769

[45] * Aug. 7, 1979

[54] HIGH THERMAL CONDUCTIVITY SUBSTRATE

[75] Inventors: Bill J. Pope; M. Duane Horton; H. Tracy Hall, all of Provo, Utah

[73] Assignee: Brigham Young University, Provo, Utah

[ * ] Notice: The portion of the term of this patent subsequent to Aug. 1, 1995, has been disclaimed.

[21] Appl. No.: 892,727

[22] Filed: Apr. 3, 1978

Related U.S. Application Data

[63] Continuation of Ser. No. 612,603, Sep. 12, 1975, Pat. No. 4,104,344.

[51] Int. Cl.² ............................................. C04B 35/52
[52] U.S. Cl. ...................................... 264/42; 264/61; 264/104
[58] Field of Search ........................... 264/42, 61, 104; 51/309 R

[56] References Cited

U.S. PATENT DOCUMENTS

| | | | |
|---|---|---|---|
| 3,348,918 | 10/1967 | Kruse | 423/446 |
| 3,683,469 | 8/1972 | Copek et al. | 264/61 |
| 3,816,085 | 6/1974 | Hall | 264/65 |
| 3,819,814 | 6/1974 | Pope | 264/125 |
| 3,829,544 | 8/1974 | Hall | 264/125 |
| 3,912,500 | 1/1975 | Vereschagin et al. | 51/309 R |

*Primary Examiner*—Robert F. White
*Assistant Examiner*—John A. Parrish
*Attorney, Agent, or Firm*—H. Ross Workman; J. Winslow Young

[57] ABSTRACT

A high thermal conductivity substrate is formed by making a sintered diamond composite and thereafter modifying the electrical properties of the composite by leaching graphite and other non-diamond materials from the composite and subsequently infusing the leached composite with material having known electrical properties. Alternatively, a diamond composite having high thermal conductivity known electrical properties if prepared and subsequently leached to remove graphite and other materials which interfere with the known electrical properties of the composite material.

2 Claims, 3 Drawing Figures

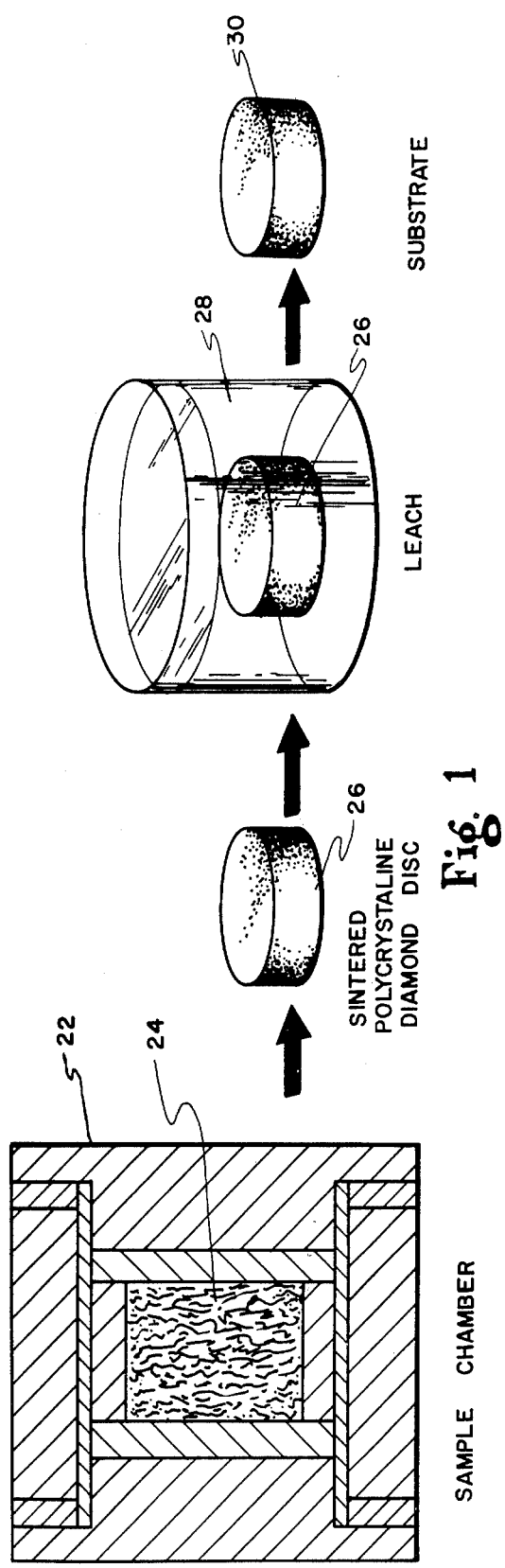

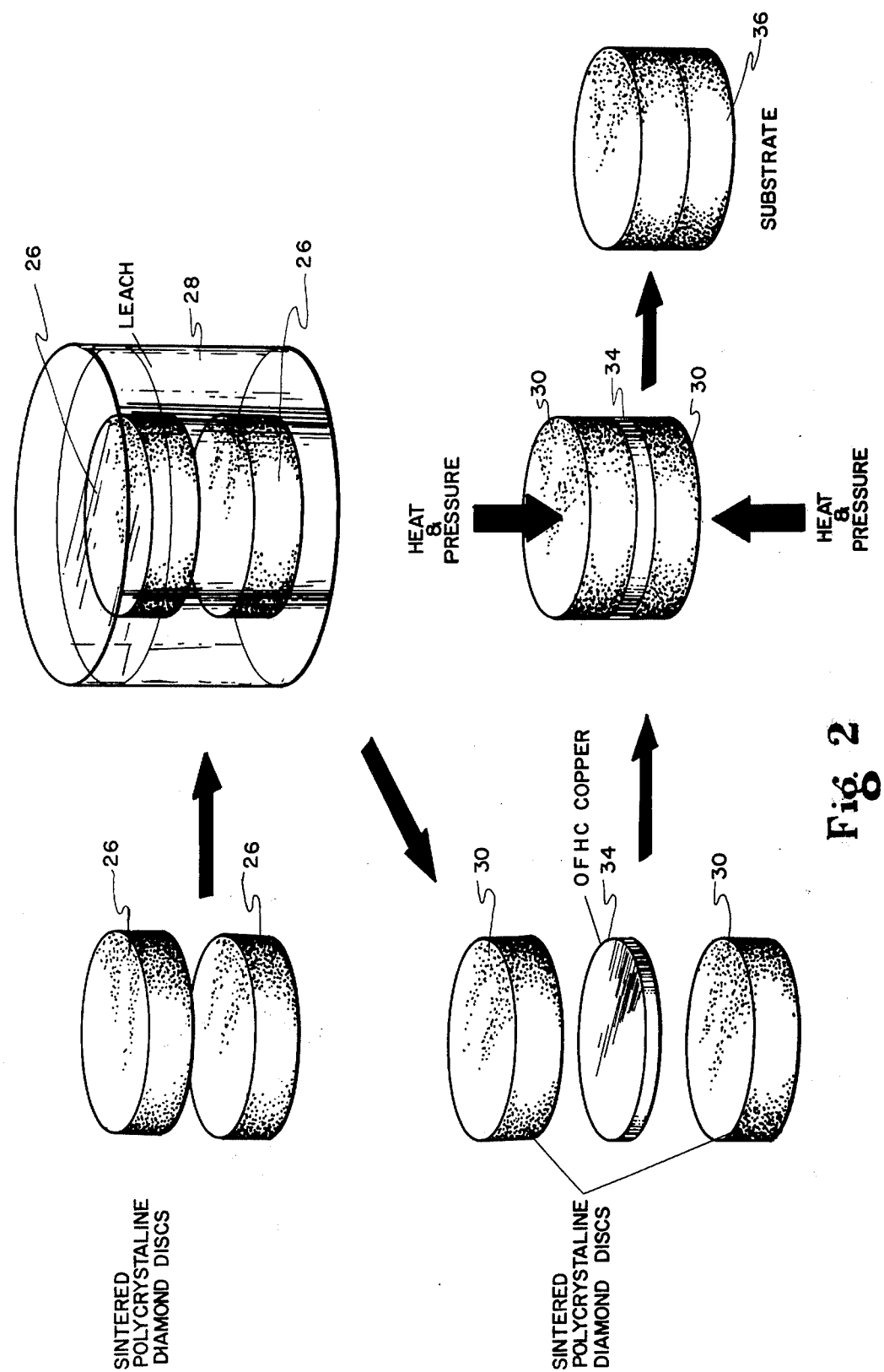

HIGH THERMAL CONDUCTIVITY SUBSTRATE

This is a continuation of application Ser. No. 612,603, filed Sept. 12, 1975, now U.S. Pat. No. 4,104,344.

BACKGROUND

1. Field of the Invention

The invention relates to high thermal conductivity substrates and more particularly to sintered diamond substrates having improved electrical properties.

2. The Prior Art

The need for high thermal conductivity substrates has been well known for a long time. For example, microwave transmission systems employ devices such as the solid state IMPATT diode oscillator. These diodes are reverse biased and often require high current densities to sustain high frequency oscillations. Flux densities of energy dissipated is greater than $10^5$ Watts/cm$^2$ which is three orders of magnitude larger than that for conventional rectifier diodes. In nearly all microwave devices, heat generated during operation at high power decreases efficiency and dissipation of the generated heat is a critical factor in limiting operation. Other devices having critical heat dissipation requirements include advanced power amplifiers. Hence, a substrate material with a thermal conductivity significantly greater than that of copper is desired. At room temperature, oxygen-free, high thermal conductivity (OFHC) copper has a thermal conductivity, k, of approximately 4 Watts/cm°C. Sintered beryllium oxide, another commonly used substrate, has a thermal conductivity of only about 1.8 Watts/cm°C. but has excellent dielectric properties, i.e., the electric field created in the substrate produces only a minimum heat component.

Type IIa single crystal natural diamond has the highest k value of any known material at room temperature and has been used for microwave device substrates. Typical values of k for the type IIa are between 20 and 30 at room temperature. Natural single crystal diamond, however, has not been used extensively because of significant cost and extreme difficulty in shaping.

The use of sintered polycrystalline diamond composites for the same purpose has met with consistent difficulty. The primary problem appears to be that the desired thermal conductivity is often accompanied by undesirable electrical characteristics. While the diamond-carbon is electrically resistant, all presently known polycrystalline diamond composites are infused with a sufficiently large quantity of graphite-carbon or other material which interferes with predictable electrical conductivity and dielectric properties.

BRIEF SUMMARY AND OBJECTS OF THE INVENTION

The present invention provides for the preparation of a high thermal conductivity substrate with known electrical properties developed by preparing a polycrystalline substrate which is treated to remove electrically conductive material interspersed throughout the composite. Thereafter, the composite may be treated or reinfused with material of known electrical conductivity. The substrate is moldable into large sizes and a variety of configurations, has superior strength and is remarkably stable under conditions of thermal shock.

It is, therefore, a primary object of the present invention to provide an improved high thermal conductivity substrate.

It is another valuable object of the present invention to provide a method of treating a polycrystalline diamond composite so as to form a desirable high thermal conductivity substrate with desirable electrical properties.

It is another valuable object of the present invention to provide a polycrystalline diamond composite with improved dielectric properties.

These and other objects and features of the present invention will become more fully apparent from the following description and appended claims taken in conjunction with the accompanying drawings.

BRIEF DESCRIPTION OF THE DRAWING

FIG. 1 is a schematic flow diagram representing a method of forming another high thermal conductivity substrate embodiment with low electrical conductivity characteristics.

FIG. 1a is a schematic representation of a product formed by the method of FIG. 1 using diamond flats in the preparation of the polycrystalline composite.

FIG. 2 is a schematic flow diagram illustrating one preferred method of forming a high thermal conductivity substrate with high electrical conductivity properties.

DETAILED DESCRIPTION OF THE PREFERRED EMBODIMENTS

General

In many solid state electronic devices, heat generated during operation at high power leads to decreased efficiency. Accordingly, dissipation of the heat generated is a critical factor in limiting operation of, for example, microwave devices and advanced power amplifiers. A commonly used heat-sink material, oxygen-free high thermal conductivity (OFHC) copper may be employed in the devices of the mentioned type. Unfortunately, OFHC copper has comparatively poor dielectric properties and is an excellent conductor of electricity. Sintered beryllium oxide, another commonly used substrate, has a thermal conductivity, k, of approximately 1.8 watt/cm°C. While the thermal conductivity of the sintered beryllium oxide is less than half that of OFHC copper, the beryllium oxide has excellent dielectric properties.

While diamond is known to have high thermal conductivity, until this present invention no sintered diamond heat-sink having controlled dielectric properties has been known. The control of the dielectric properties of the diamond heat-sink of this invention is effected by altering the graphite content of the sintered diamond. In the sintering process, a partial conversion of diamond to graphite inevitably occurs. The effect of the graphite to diamond ratio on the specific resistance of sintered diamond composites is set forth in Table I below.

TABLE I

Specific Resistance of Six Sintered Diamond Samples versus Graphite to Diamond Ratio

| Graphite Volume/ Diamond Volume | Specific Resistance, Ohm-cm |
| --- | --- |
| 0 (Natural Diamond) | $10^{16}$ |
| 0.5 | $2.2 \times 10^3$ |

TABLE I-continued
Specific Resistance of Six Sintered
Diamond Samples versus Graphite to
Diamond Ratio

| Graphite Volume/<br>Diamond Volume | Specific Resistance,<br>Ohm-cm |
|---|---|
| 1.5 | 140 |
| 1.6 | .73 |
| 3.4 | .4 |
| 6.3 | .06 |
| 11.4 | .03 |

It has now been found that the graphite can be leached from the sintered diamond composite without appreciable loss of diamond and with attendant increase in electrical resistance of the sample.

Embodiment of FIG. 1

In order to make a diamond substrate according to the invention, a polycrystalline diamond composite must be prepared. Composites prepared according to the teachings of U.S. Pat. Nos. 3,816,085; 3,819,814 and 3,829,544 may be used. Although any suitable substrate configuration may be formed, the preparation of disc-shaped composites will be illustrated for convenience.

Referring more particularly to FIG. 1, a sample cube generally designated 22 is formed of pyrophyllite and is assembled as described in U.S. Pat. No. 3,829,544. The sample cube internally incorporates a graphite resistance heater for particulate diamond matrix 24 situated within the sample cube 22. In accordance with the illustrated embodiment, it is desirable that the sintered diamond composite have a thermal conductivity of greater than 1.8 watt/cm°C. In order that the composites resulting from the four described sintering techniques will have thermal conductivities predominantly greater than 1.8 watt/cm°C., careful selection of the matrix particle size has been found very useful. More specifically, the combination of comparatively large diamond particles with comparatively small particles has the effect of increasing the density of the composite and at the same time increasing the thermal conductivity. The examples set forth in Table II, below, illustrate the surprisingly high thermal conductivity achieved according to this method:

TABLE II

| Matrix Composition | Maximum Thermal<br>Conductivity<br>Watt/cm °C. |
|---|---|
| Type I natural diamond,<br>1-5 micron; diamond flats,<br>20 mesh | 7.9 |
| Synthetic diamond,<br>20-40 micron; diamond flats<br>20 mesh | 7.3 |
| Synthetic blocky diamond of<br>the following blend<br>54% 30/40 mesh<br>18% 60/80 mesh<br>18% 270/325 mesh<br>7% 10-20 micron<br>3% 1-5 micron | 9.2 |

It is also pointed out that the diamond matrix may be provided with additives before sintering. These additives have conventionally included transition metals, refractory metals and non-metals. The principal value of the additives is to modify the temperature and pressure conditions in which the sintered diamond is formed.

The sample cube 22, when filled with the matrix 24, is placed in a conventional high-pressure press and sintered. The resulting product is a disc 26 which is a sintered polycrystalline composite characterized by direct diamond-to-diamond bonds and having some porosity. After sintering, the polycrystalline disc 26 is perfused with graphite and while the thermal conductivity is desirably high, the electrical properties are undesirable or, at best, unpredictable.

The disc 26 is then subjected to leaching at 28 in order to remove the graphite. One presently preferred chemical leaching method includes placing the disc 26 in a bath of molten sodium nitrate at approximately 340° C. Another suitable leaching solution is hot percloric acid. Both of the mentioned leaching solutions will remove the graphite without adversely affecting the diamond in the composite disc 26. Leaching, in this specification means any chemical or electrical oxidizing system which will oxidize graphite to carbon dioxide or other soluble form in the presence of diamond without adversely affecting the diamond.

The leached composite 30 has a markedly increased electrical resistance. By way of example, the normally highly electrically conductive diamond composites set forth in Table II were leached using molten sodium nitrate and developed the electrical resistance set forth in Table III below:

TABLE III

| Matrix Composition | Electrical Resistance<br>After Leaching, Ohm-cm |
|---|---|
| Type I natural diamond,<br>1-5 micron size; diamond<br>flats, 20 mesh | $2.8 \times 10^{11}$ |
| Synthetic diamond,<br>20-40 micron size; diamond<br>flats, 20 mesh | $10^{12}$ |
| Synthetic blocky diamond of<br>the following blend<br>54% 30/40 mesh<br>18% 60/80 mesh<br>18% 270/325 mesh<br>7% 10-20 micron<br>3% 1-5 micron | $10^{12}$ |

The leached polycrystalline composite 30 comprises generally randomly oriented diamond particles bonded to adjacent particles and having a porosity resulting partially from the leaching out of graphite and other additives, if any, in the composite. The leaching did not seriously adversely affect the thermal conductivity, maximum reduction being about 0.5 watts/cm°C.

In some instances, significantly increased thermal conductivity can be obtained using comparatively large (20 mesh) diamond flats oriented parallel to the longitudinal axis of the disc 26. The resulting leached composite 32 is illustrated in FIG. 1a.

Re-establishing Conductivity

If a high thermal conductivity heat-sink having high electrical resistance is desired, the leached composites 30 and 32 can be used. It is often desirable, however, to prepare a high thermal conductivity substrate with electrical conductivity increased to a selected level. This technique for modifying the leached composites 30 or 32 to adjust the electrical conductivity is illustrated in FIG. 2.

Referring now to FIG. 2, polycrystalline diamond composites in the form of discs 26 are manufactured and leached as at 28 in the manner set forth above to form leached discs 30. It has been found desirable to infuse the porous polycrystalline composite discs 30 with a material having a known electrical conductivity and which will not adversely affect the thermal conductivity on the diamond composites. Suitable materials include silver, glass and OFHC copper. For purposes of example only, OFHC copper is illustrated in FIG. 2.

A thin wafer of material 34 having known electrical conductivity characteristics e.g. OFHC copper is sandwiched between the two composite discs 30. Thereafter, the sandwiched assembly is placed in a sample cube such as Cube 22 illustrated in FIG. 1 and subjected to heat and pressure. The heat must be above the melting point of the material 34 and preferably the heat and pressure conditions are chosen so as to minimize the conversion of the diamond to graphite.

The heat and pressure treatment causes the OFHC copper to perfuse through the adjacent discs so as to form a unitary substrate 36. Clearly, any suitable number of discs may be perfused with the material 34. Moreover, while a disc configuration is illustrated, any desirable configuration of material could be used.

By way of example only, polycrystalline diamond composite discs formed from Type IIa natural diamond in sizes 40/400 mesh and infiltrated with OFHC copper had a thermal conductivity of 5.8 Watts/cm°C. and an electrical resistance of less than 110 Ohm-cm. The precise electrical resistance and thermal conductivity will, of course, depend upon the material perfused and the thermal conductivity of the particular diamond disc used.

High thermal conductivity substrates manufactured as set forth above were found to have surprisingly high thermal conductivity and highly desirable dielectric properties. Moreover, the electrical conductivity can be modified by leaching the graphite from the polycrystalline diamond. Further, if desired, the leached polycrystalline diamond may be perfused with materials having known electrical conductivity. The resulting substrate further has predetermined dimensions and configuration coupled with the superior strength typical of diamond composites.

The invention may be embodied in other specific forms without departing from its spirit or essential characteristics. The described embodiments are to be considered in all respects only as illustrative and not restrictive and the scope of the invention is, therefore, indicated by the appended claims rather than by the foregoing discription. All changes which come within the meaning and range of equivalency of the claims are to be embraced within their scope.

What is claimed and desired to be secured by U.S. Patent Letters Patent is:

1. A method of making a high thermal conductivity substrate for use as a heat sink comprising the steps of:
    combining diamond particles with at least one diamond flat in a sample chamber and orienting the flat parallel to the longitudinal axis of the chamber so as to increase the thermal conductivity of the resulting substrate;
    sintering the combination of diamond particles and the diamond flat under elevated temperature and pressure conditions until a unitary polycrystalline diamond composite is formed; and
    leaching the graphite from the diamond composite so as to remove undesirable electrical conductivity properties of the composite.

2. A method of making a high thermal conductivity substrate for use as a heat sink comprising the steps of:
    combining diamond particles of two different sizes in a sample chamber so as to increase the thermal conductivity of the resulting substrate, the size ratio being on the order of 5:1 to 100:1;
    sintering the combination of diamond particles under elevated temperature and pressure conditions until a unitary polycrystalline composite is formed; and
    leaching graphite from the diamond composite so as to remove undesirable electrical conductivity properties of the composite.

* * * * *